United States Patent
Quan

(10) Patent No.: US 12,520,656 B2
(45) Date of Patent: Jan. 6, 2026

(54) CHARGE GENERATION LAYER, ORGANIC ELECTROLUMINESCENT DEVICE AND ORGANIC LIGHT-EMITTING APPARATUS

(71) Applicant: BOE Technology Group Co., Ltd., Beijing (CN)

(72) Inventor: Wei Quan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 412 days.

(21) Appl. No.: 18/021,733

(22) PCT Filed: Apr. 26, 2022

(86) PCT No.: PCT/CN2022/089383
§ 371 (c)(1),
(2) Date: Feb. 16, 2023

(87) PCT Pub. No.: WO2023/206099
PCT Pub. Date: Nov. 2, 2023

(65) Prior Publication Data
US 2024/0268142 A1    Aug. 8, 2024

(51) Int. Cl.
*H10K 50/165* (2023.01)
*H10K 50/17* (2023.01)
*H10K 50/19* (2023.01)
*H10K 85/60* (2023.01)
*H10K 102/00* (2023.01)

(52) U.S. Cl.
CPC ......... *H10K 50/165* (2023.02); *H10K 50/171* (2023.02); *H10K 50/19* (2023.02); *H10K 85/6572* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 2013/0069077 A1* | 3/2013 | Song | H10K 50/19 257/E33.013 |
| 2016/0285010 A1* | 9/2016 | Yoon | H10K 85/622 |
| 2017/0279064 A1* | 9/2017 | Wallikewitz | H10K 50/165 |
| 2020/0194704 A1* | 6/2020 | Seo | H10K 85/6574 |
| 2020/0203650 A1* | 6/2020 | Kim | H10K 50/16 |
| 2021/0373067 A1* | 12/2021 | Xi | H10K 50/19 |

* cited by examiner

*Primary Examiner* — Khaja Ahmad
(74) *Attorney, Agent, or Firm* — IPro, PLLC

(57) ABSTRACT

A charge generation layer, an organic electroluminescent device, and an organic light-emitting apparatus. A material of the charge generation layer includes a first electron transport material, a second electron transport material, and a first metal material doped in the first electron transport material and the second electron transport material, and the electron mobility of the first electron transport material is different from that of the second electron transport material.

19 Claims, 7 Drawing Sheets

CHARGE GENERATION LAYER, ORGANIC ELECTROLUMINESCENT DEVICE AND ORGANIC LIGHT-EMITTING APPARATUS

The present application is a National Stage of International Application No. PCT/CN2022/089383, filed on Apr. 26, 2022, which is hereby incorporated by reference in its entirety.

FIELD

The present disclosure relates to the technical field of electroluminescence, in particular to a charge generation layer, an organic electroluminescent device, and an organic light-emitting apparatus.

BACKGROUND

An organic electroluminescent device (Organic Light-Emitting Device, OLED) is a display device in which light emission is achieved by electrically exciting phosphors or phosphor organic compounds. The organic electroluminescent device (OLEDs) is considered to have great prospects for application in the display field due to its numerous advantages of self-luminescence, all solid state, wide viewing angle, fast response, and the like.

A conventional organic electroluminescent device includes an anode, a cathode and a light-emitting functional layer (a light-emitting element) arranged between the anode and the cathode. Driven by an external voltage, holes injected from the anode and electrons injected from the cathode enter a recombination region of the light-emitting unit to be recombined to form excitons, and the excitons conduct radiative transition to emit photons so as to form electroluminescence. Then, since holes and electrons have different mobilities, the injection of holes and electrons is not balanced, so that the actual luminous efficiency of the organic electroluminescent device is low.

Currently, in order to improve the luminous brightness and luminous efficiency, more and more research is focused on stacked-layer devices, which usually use a charge generation layer as a connecting layer to connect a plurality of light-emitting elements in series, and the stacked-layer devices often have multiple current efficiency and luminous brightness compared with unit devices.

SUMMARY

An embodiment of the present disclosure provides a charge generation layer, an organic electroluminescent device, and an organic light-emitting apparatus. A specific solution is as follows.

An embodiment of the present disclosure provides a charge generation layer, wherein a material of the charge generation layer includes a first electron transport material, a second electron transport material, and a first metal material doped in the first electron transport material and the second electron transport material, and an electron mobility of the first electron transport material is different from an electron mobility of the second electron transport material.

In one possible implementation, in the above charge generation layer provided by the embodiment of the present disclosure, a ratio of the electron mobility of the first electron transport material to the electron mobility of the second electron transport material is greater than or equal to 10 and less than or equal to 100.

In one possible implementation, in the above charge generation layer provided by the embodiment of the present disclosure, a thickness of the charge generation layer is less than or equal to 20 nm.

In one possible implementation, in the above charge generation layer provided by the embodiment of the present disclosure, the charge generation layer includes first charge generation layers and second charge generation layers which are alternately stacked, wherein a material of the first charge generation layer includes the first electron transport material, the second electron transport material, and the first metal material, a material of the second charge generation layer is different from the material of the first charge generation layer, and a quantity of the second charge generation layers is greater than a quantity of the first charge generation layers.

In one possible implementation, in the above charge generation layer provided by the embodiment of the present disclosure, the material of the second charge generation layer includes a third electron transport material and a second metal material doped in the third electron transport material.

In one possible implementation, in the above charge generation layer provided by the embodiment of the present disclosure, the third electron transport material is the same as the first electron transport material or the third electron transport material is the same as the second electron transport material; and the second metal material is the same as the first metal material.

In one possible implementation, in the above charge generation layer provided by the embodiment of the present disclosure, the sum of the quantity of the first charge generation layers and the quantity of the second charge generation layers is in a range of 3 to 7.

In one possible implementation, in the above charge generation layer provided by the embodiment of the present disclosure, the quantity of the first charge generation layers is greater than or equal to 2, and a doping concentration of the first metal material in the first charge generation layers varies in a gradient along the thickness direction of the charge generation layer.

In one possible implementation, in the above charge generation layer provided by the embodiment of the present disclosure, a thickness of the first charge generation layer is less than or equal to 3 nm, and a thickness of the second charge generation layer is less than or equal to 3 nm.

In one possible implementation, in the above charge generation layer provided by the embodiment of the present disclosure, the first metal material and the second metal material each include lithium.

In one possible implementation, in the above charge generation layer provided by the embodiment of the present disclosure, a doping concentration of the first metal material and a doping concentration of the second metal material are in a range of 1%-5%.

In one possible implementation, in the above charge generation layer provided by the embodiment of the present disclosure, the first electron transport material includes 1,3,5-tris(1-phenyl-1H-benzoimidazol-2-yl)benzene, and the second electron transport material includes phenanthroline.

Accordingly, an embodiment of the present disclosure also provides an organic electroluminescent device, including: a first electrode; a second electrode opposite to the first electrode; at least two light-emitting functional layers, stacked with each other and located between the first electrode and the second electrode; and a charge generation layer between every two adjacent light-emitting functional layers; wherein the charge generation layer is any one of the charge generation layers provided by the embodiment of the present disclosure.

In one possible implementation, in the above organic electroluminescent device provided by the embodiment of the present disclosure, the at least two light-emitting functional layers include a first light-emitting functional layer, a second light-emitting functional layer, and a third light-emitting functional layer which are stacked, wherein the first light-emitting functional layer is close to the first electrode, the third light-emitting functional layer is close to the second electrode, and the first light-emitting functional layer, the second light-emitting functional layer, and the third light-emitting functional layer are provided with different light emission colors.

In one possible implementation, in the above organic electroluminescent device provided by the embodiment of the present disclosure, the first light-emitting functional layer includes a first hole injection layer, a first hole transport layer, a first light-emitting layer and a first electron transport layer which are stacked in sequence, wherein the first hole injection layer is close to the first electrode.

In one possible implementation, in the above organic electroluminescent device provided by the embodiment of the present disclosure, the second light-emitting functional layer includes a second hole transport layer, a second light-emitting layer and a second electron transport layer which are stacked in sequence, wherein the second hole transport layer is close to the first electrode.

In one possible implementation, in the above organic electroluminescent device provided by the embodiment of the present disclosure, the third light-emitting functional layer includes a third hole transport layer, a third light-emitting layer, a third electron transport layer and a first electron injection layer which are stacked in sequence, wherein the third hole transport layer is close to the first electrode.

In one possible implementation, in the above organic electroluminescent device provided by the embodiment of the present disclosure, the first electrode is an anode and the second electrode is a cathode.

Accordingly, an embodiment of the present disclosure also provides an organic light-emitting apparatus, including any one of the organic electroluminescent devices provided by the embodiment of the present disclosure.

DETAILED DESCRIPTION OF THE EMBODIMENTS

Figure 1:
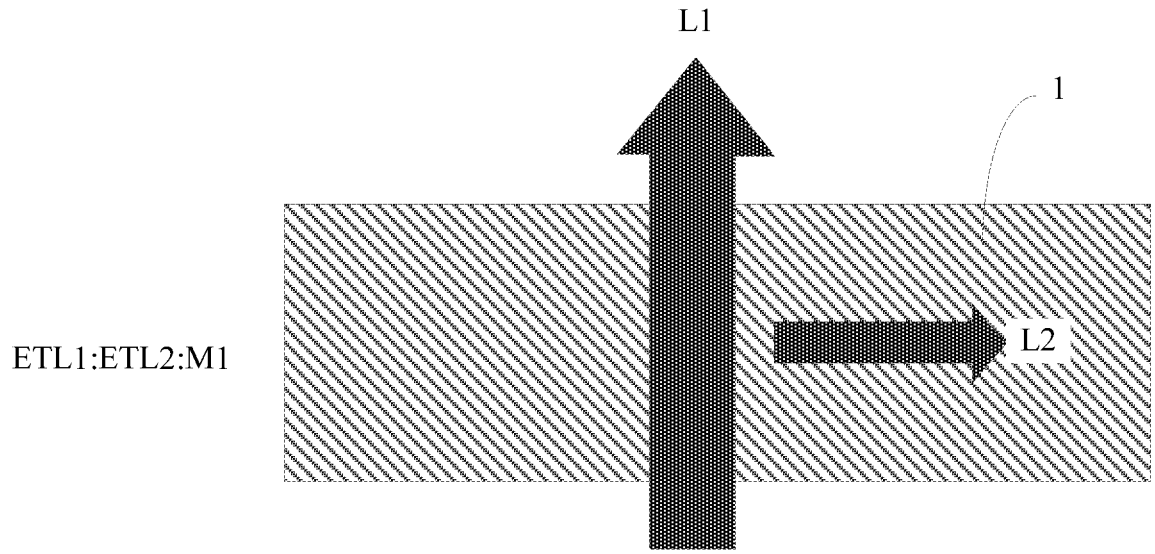
FIG. 1 is a schematic structural diagram of a charge generation layer according to an embodiment of the present disclosure.

In order to make objectives, technical solutions and advantages of the embodiments of the present disclosure clearer, the technical solutions of the embodiments of the present disclosure are described clearly and completely below with reference to the drawings of the embodiments of the present disclosure. Apparently, the described embodiments are some, not all, of the embodiments of the disclosure. The embodiments in the present disclosure and features of the embodiments may be combined with each other without conflict. On the basis of the described embodiments of the present disclosure, all other embodiments obtained by those of ordinary skill in the art without creative work fall within the protection scope of the present disclosure.

Unless otherwise defined, the technical or scientific terms used in the present disclosure shall have the ordinary meaning as understood by those of ordinary skill in the art to which the present disclosure belongs. Similar words such as "including" or "comprising" used in the present disclosure mean that elements or objects appearing in front of the word cover elements or objects listed behind the word and equivalents thereof, without excluding other elements or objects. Similar words such as "connection" or "connected" are not limited to physical or mechanical connection, but may include electrical connection, whether direct or indirect. "Inner", "outer", "upper", "lower", etc. are merely used to indicate a relative positional relation, which may also change accordingly when the absolute position of the described object changes.

It should be noted that sizes and shapes of all figures in the drawings do not reflect a true scale and are only intended to illustrate the contents of the present disclosure. In addition, the same or similar reference signs throughout denote the same or similar elements or elements having the same or similar functions.

With the development of a display technology, pursuing high resolution (PPI) display is a user's need for display products. Since the distance between adjacent pixels is relatively short in display products with high PPI, and a charge generation layer of an organic electroluminescent device is generally disposed on a whole surface, the high transverse conductivity of the charge generation layer easily leads to the crosstalk problem of the adjacent pixels, which leads to the transverse leakage problem of the adjacent pixels.

In view of this, an embodiment of the present disclosure provides a charge generation layer 1, as shown in FIG. 1, a material of the charge generation layer 1 includes a first electron transport material ETL1, a second electron transport material ETL2 and a first metal material M1 doped in the first electron transport material ETL1 and the second electron transport material ETL2, wherein the electron mobility $\mu_1$ of the first electron transport material ETL1 is different from the electron mobility $\mu_2$ of the second electron transport material ETL2.

A light-emitting functional layer of an electroluminescent device mainly includes an electron injection layer, an electron transport layer, a light-emitting layer, a hole transport layer and a hole injection layer. Due to the influence of the material properties of film layers in the light-emitting functional layer, the electroluminescent device is generally in multi-electron system, in this way, the quantity of electrons transported laterally is also large. In the embodiments of the present disclosure, by employing a first electron transport material and a second electron transport material which have different electron mobilities, the first electron transport material and the second electron transport material mainly provide electrons, and the difference in mobility may increase the difficulty of electron transport, which generally reduce the potential for transverse leakage; and by interaction and restriction of the doped first metal material with the first electron transport material and the second electron transport material, the carrier flow has a certain directionality, which can reduce the quantity of electrons transported laterally, and increase the quantity of electrons transported longitudinally; and when the charge generation layer is applied to an organic electroluminescent device, the problem of transverse leakage can be reduced, and the color gamut of the organic electroluminescent device can be increased, thereby prolonging the service life of the organic electroluminescent device.

Specifically, as shown in FIG. 1, electrons transported laterally in the charge generation layer 1 are indicated by an arrow L2, and electrons transported longitudinally in the charge-generation layer 1 are indicated by an arrow L1, and the arrow L2 is thinner, indicating that the quantity of electrons transported laterally is small; and the arrow L1 is thicker, indicating the quantity of electrons transported longitudinally is large.

In specific implementation, in the above charge generation layer provided by the embodiment of the present disclosure, as shown in FIG. 1, a ratio $\mu_1/\mu_2$ of the electron mobility $\mu_1$ of the first electron transport material ETL1 to the electron mobility $\mu_2$ of the second electron transport material ETL2 is greater than or equal to 10 and less than or equal to 100. In this way, the transverse leakage problem of the charge generation layer in the high PPI pixel design can be effectively improved, the light emission phenomenon of adjacent pixels is reduced, and the color gamut of the electroluminescent device can be improved by about 5%.

In specific implementation, in the above charge generation layer provided by the embodiment of the present disclosure, as shown in FIG. 1, the charge generation layer 1 has a thickness of less than or equal to 20 nm. For example, the thickness of the charge generation layer 1 may be 5 nm, 10 nm, 15 nm, 20 nm, or the like.

In specific implementation, in the above charge generation layer provided by the embodiment of the present disclosure, as shown in FIG. 1, the first metal material can include, but is not limited to, lithium. For example, the first metal material may be a doped lithium salt or the like.

In specific implementation, in the above charge generation layer provided by the embodiment of the present disclosure, as shown in FIG. 1, the doping concentration of the first metal material M1 is in a range of 1%-5%. In particular, if the doping concentration of the first metal material M1 is less than 1%, the charge generation layer 1 generates a small number of charges, which is detrimental to improving the device efficiency; if the doping concentration of the first metal material M1 is greater than 5%, the first metal material M1 is prone to diffusion, resulting in device instability; and thus, in the embodiment of the present disclosure, the doping concentration of the first metal material M1 is preferably in the range of 1%-5%.

In specific implementation, in the above charge generation layer provided by the embodiment of the present disclosure, as shown in FIG. 1, the first electron transport material ETL1 includes, but is not limited to, 1,3,5-tris(1-phenyl-1H-benzoimidazol-2-yl)benzene, and the second electron transport material ETL2 includes, but is not limited to, phenanthroline. In particular, as long as the condition that the ratio $\mu_1/\mu_2$ of the electron mobility $\mu_1$ of the first electron transport material ETL1 to the electron mobility $\mu_2$ of the second electron transport material ETL2 is greater than or equal to 10 and less than or equal to 100 is met, both electron transport materials fall within the scope of protection of the embodiments of the present disclosure, which will not be listed here.

Figure 2:
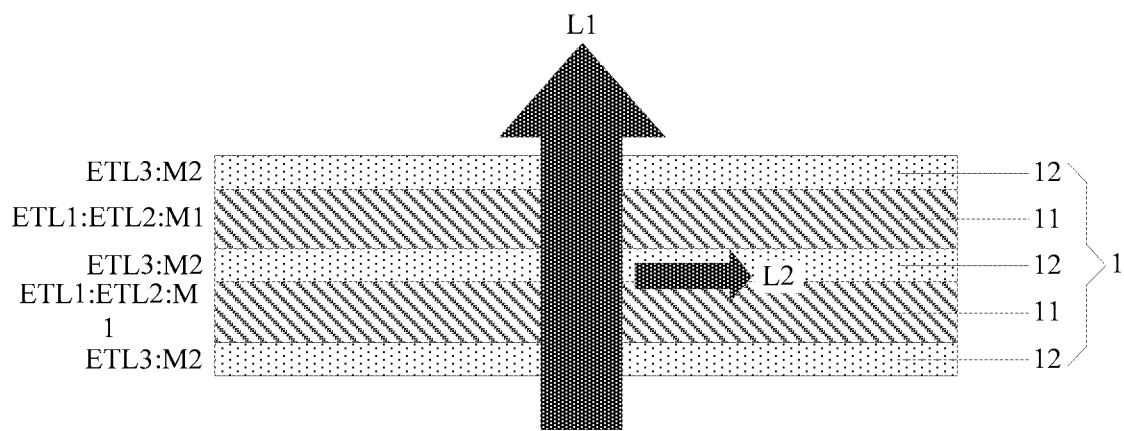
FIG. 2 is a schematic structural diagram of yet another charge generation layer according to an embodiment of the present disclosure.

In specific implementation, in the above charge generation layer provided by the embodiment of the present disclosure, as shown in FIG. 2, the charge generation layer 1 includes first charge generation layers 11 and second charge generation layers 12 which are alternately stacked, wherein a material of the first charge generation layer 11 includes the first electron transport material ETL1 described above, the second electron transport material ETL2 described above, and the first metal material M1 described above, a material of the second charge generation layer 12 is different from the material of the first charge generation layer 11, and the quantity of the second charge generation layers 12 is greater than that of the first charge generation layers 11. Specifically, the charge generation layer 1 is arranged to include the first charge generation layers 11 and the second charge generation layers 12, which are alternately stacked, the material of the first charge generation layer 11 includes the first electron transport material ETL1, the second electron transport material ETL2 and the first metal material M1, and the ratio $\mu_1/\mu_2$ of the electron mobility $\mu_1$ of the first electron transport material ETL1 to the electron mobility $\mu_2$ of the second electron transport material ETL2 is different (preferably $\mu_1/\mu_2$ is greater than or equal to 10 and less than or equal to 100), in this way, the quantity of electrons transported laterally can be reduced, the quantity of electrons transported longitudinally can be increased, and when the charge generation layer is applied to the organic electroluminescent device, the problem of transverse leakage can be reduced, and the color gamut of the organic electroluminescent device can be increased, thereby prolonging the service life of the organic electroluminescent device.

In specific implementation, in the above charge generation layer provided by the embodiment of the present disclosure, as shown in FIG. 2, the material of the second charge generation layer 12 can include a third electron transport material ETL3 and a second metal material M2 doped in the third electron transport material ETL3. In particular, the third electron transport material ETL3 may be the same as the first electron transport material ETL1, or the third electron transport material ETL3 may also be the same as the second electron transport material ETL2; and the second metal material M2 may be the same as the first metal material M1.

In specific implementation, in the above charge generation layer provided by the embodiment of the present disclosure, as shown in FIG. 2, the first metal material M1 in the first charge generation layer 11 can include lithium, and the second metal material M2 in the second charge generation layer 12 can include lithium. For example, the first metal material M1 and the second metal material M2 may be a doped lithium salt or the like.

In specific implementation, in the above charge generation layer provided by the embodiment of the present disclosure, as shown in FIG. 2, the doping concentration of the first metal material M1 in the first charge generation layer 11 is in a range of 1%-5%, and the doping concentration of the second metal material M2 in the second charge generation layer 12 is in a range of 1%-5%. Specifically, if both the doping concentration of the first metal material M1 and the doping concentration of the second metal material M2 are less than 1%, the first charge generation layers 11 and the second charge generation layers 12 generate a small number of charges, which is detrimental to improving the device efficiency; if both the doping concentration of the first metal material M1 and the doping concentration of the second metal material M2 are greater than 5%, the first metal material M1 and the second metal material M2 are prone to diffusion, resulting in device instability; and thus, in the embodiment of the present disclosure, the doping concentration of the first metal material M1 and the doping concentration of the second metal material M2 are preferably in the range of 1%-5%.

In specific implementation, in the above charge generation layer provided by the embodiment of the present disclosure, as shown in FIG. 2, the first electron transport material ETL1 in the first charge generation layer 11 includes, but is not limited to, 1,3,5-tris(1-phenyl-1H-benzoimidazol-2-yl)benzene, and the second electron transport material ETL2 in the first charge generation layer 11 includes, but is not limited to, phenanthroline; the third electron transport material ETL3 in the second charge generation layer 12 may be 1,3,5-tris(1-phenyl-1H-benzoimidazol-2-yl)benzene, or the third electron transport material ETL3 in the second charge generation layer 12 may be phenanthroline.

In specific implementation, in the above charge generation layer provided by the embodiment of the present disclosure, as shown in FIG. 2, the sum of the quantity of the first charge generation layers 11 and the quantity of the second charge generation layers 12 may be 3 to 7. For example, the sum of the quantity of the first charge generation layers 11 and the quantity of the second charge generation layers 12 may be 3, wherein one first charge generation layer 11 is provided, two second charge generation layers 12 are provided, and the first charge generation layer 11 is positioned between the two second charge generation layers 12; for example, the sum of the quantity of the first charge generation layers 11 and the quantity of the second charge generation layers 12 may be 5, wherein two first charge generation layers 11 are provided, three second charge generation layers 12 are provided, and one first charge generation layer 11 is arranged between every two adjacent second charge generation layers 12; and for example, the sum of the quantity of the first charge generation layers 11 and the quantity of the second charge generation layers 12 may be 7, wherein three first charge generation layers 11 are provided, four second charge generation layers 12 are provided, and one first charge generation layer 11 is arranged between every two adjacent second charge generation layers 12.

It should be noted that FIG. 2 of an embodiment of the present disclosure is illustrated by taking the condition that the sum of the quantity of the first charge generation layers 11 and the quantity of the second charge generation layers 12 is 5 as an example.

In specific implementation, in the above charge generation layer provided by the embodiment of the present disclosure, as shown in FIG. 2, the quantity of the first charge generation layers 11 is greater than or equal to 2 (e.g., is two layers), and the doping concentration of the first metal material M1 in the first charge generation layers 11 varies in a gradient along the thickness direction of the charge generation layer 1. For example, the doping concentration of the first metal material M1 in the relatively bottommost first charge generation layer 11 is 2%, the doping concentration of the first metallic material M1 in the relatively topmost first charge generation layer 11 is 4%, of course, the doping concentration of the first metal material M1 in the first charge generation layers 11 is set according to actual needs, and when the charge generation layer 1 is applied to an organic electroluminescent device, the film layer position of the first charge generation layer 11 having a high doping concentration is selected as required.

Specifically, lithium is an active metal and easily causes material changes, and the doping concentration of the first metal material M1 in the first charge generation layers 11 varies in a gradient in order to achieve the balance between device requirements and reduction of lithium diffusion, thus ensuring the device stability and the transport performance.

In specific implementation, in the above charge generation layer provided by the embodiment of the present disclosure, as shown in FIG. 2, the thickness of the first charge generation layer 11 may be less than or equal to 3 nm, for example, the thickness of the first charge generation layer 11 may be 1 nm, 2 nm, or 3 nm; the thickness of the second charge generation layer 12 may be less than or equal to 3 nm, for example, the thickness of the second charge generation layer 12 may be 1 nm, 2 nm, or 3 nm.

In summary, when the above charge generation layer provided by the embodiment of the present disclosure is applied to an organic electroluminescent device, the problem of transverse leakage can be improved, and by setting the concentration of doped Li reasonably, the Li concentration diffusion can be improved, improving the stability of the device.

Figure 3:
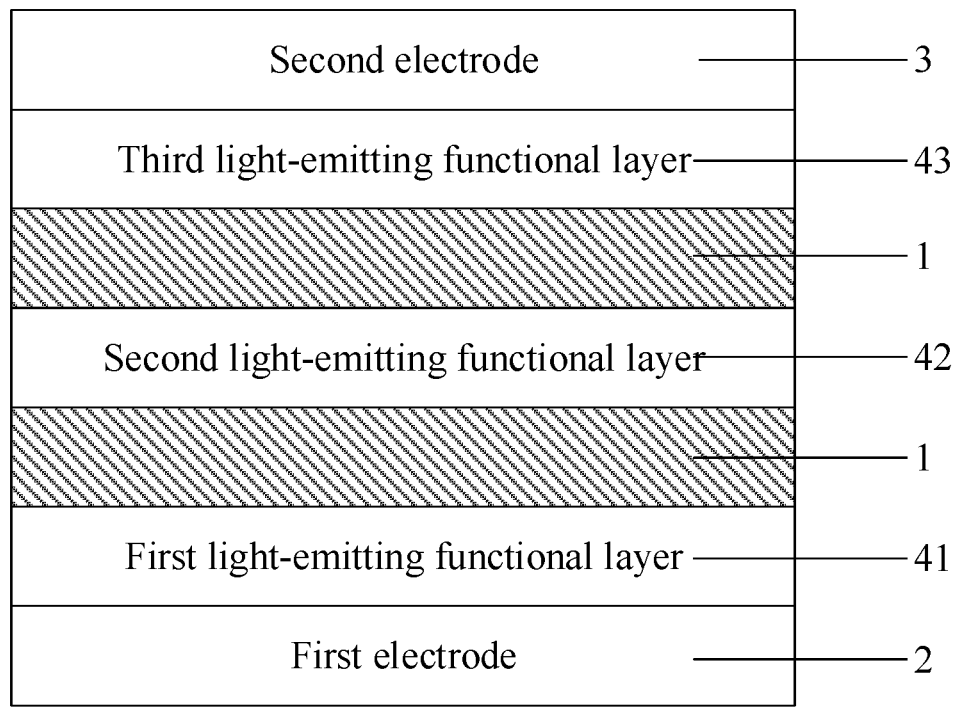
FIG. 3 is a schematic structural diagram of an organic electroluminescent device according to an embodiment of the present disclosure.
Figure 4:
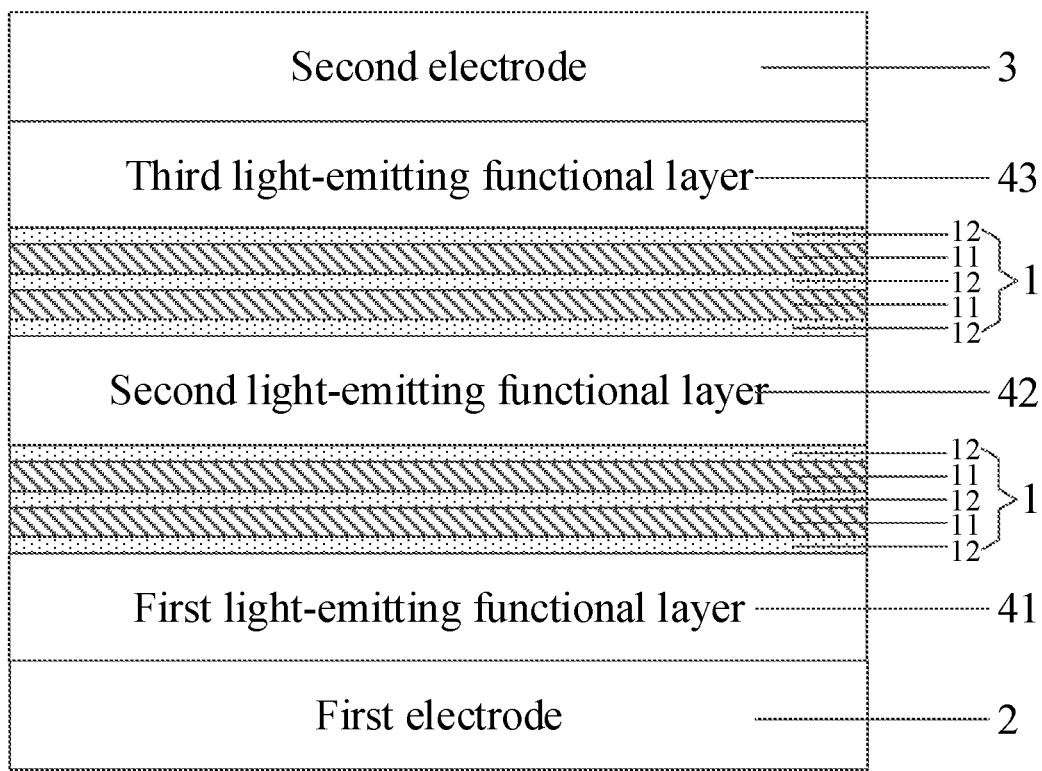
FIG. 4 is a schematic structural diagram of yet another organic electroluminescent device according to an embodiment of the present disclosure.

Based on the same inventive concept, an embodiment of the present disclosure also provides an organic electroluminescent device, as shown in FIGS. 3 and 4, including: a first electrode 2; a second electrode 3 opposite to the first electrode 1; at least two light-emitting functional layers (taking three light-emitting functional layers as an example, indicated by 41, 42 and 43, respectively), stacked with each other and located between the first electrode 2 and the second electrode 3; and a charge generation layers 1 between every two adjacent light-emitting functional layers; wherein the charge generation layer 1 is the above charge generation layer 1 provided according to the embodiment of the present disclosure.

According to the above organic electroluminescent device provided by the embodiment of the present disclosure, one charge generation layer is arranged between every two adjacent light-emitting functional layers, and the charge generation layer adopts a first electron transport material and a second electron transport material which have different electron mobilities, the first electron transport material and the second electron transport material mainly providing electrons, by interaction and restriction of the doped first metal material with the first electron transport material and the second electron transport material, the quantity of electrons transported laterally can be reduced, the quantity of electrons transported longitudinally can be increased, and the charge generation layer is applied to the organic electroluminescent device, the problem of transverse leakage can be reduced, and the color gamut of the organic electroluminescent device can be increased, thereby prolonging the service life of the organic electroluminescent device.

It should be noted that the specific structure and material of the charge generation layers in the above organic electroluminescent device provided by the embodiment of the present disclosure can refer to the related description of the above charge generation layer, the structure and material of the charge generation layers shown in FIG. 3 of the embodiment of the present disclosure are the same as those of the charge generation layer shown in FIG. 1, the structure and material of the charge generation layers shown in FIG. 4 are the same as those of the charge generation layer shown in FIG. 2, and the problem to be solved is that display products with high PPI tend to cause transverse leakage, which will not be repeated here.

In specific implementation, in the above organic electroluminescent device provided by the embodiment of the present disclosure, as shown in FIGS. 3 and 4, the at least two light-emitting functional layers (41, 42, and 43) may include a first light-emitting functional layer 41, a second light-emitting functional layer 42, and a third light-emitting functional layer 43 which are stacked, wherein the first light-emitting functional layer 41 is close to the first electrode 2, the third light-emitting functional layer 43 is close to the second electrode 3, and the first light-emitting functional layer 41, the second light-emitting functional layer 42, and the third light-emitting functional layer 43 are provided with different light emission colors. Specifically, the light emission color of the first light-emitting functional layer 41 may be red, the light emission color of the second light-emitting functional layer 42 may be green, and the light emission color of the third light-emitting functional layer 43 may be blue, and full color display can be achieved by three primary colors of red, green and blue.

In specific implementation, in the above organic electroluminescent device provided by the embodiment of the present disclosure, as shown in FIGS. 3 and 4, the first electrode 2 may be an anode, and the second electrode 3 may be a cathode. In particular, a material of the anode and a material of the cathode are the same as those in the prior art, and are not described in detail herein.

Figure 5:
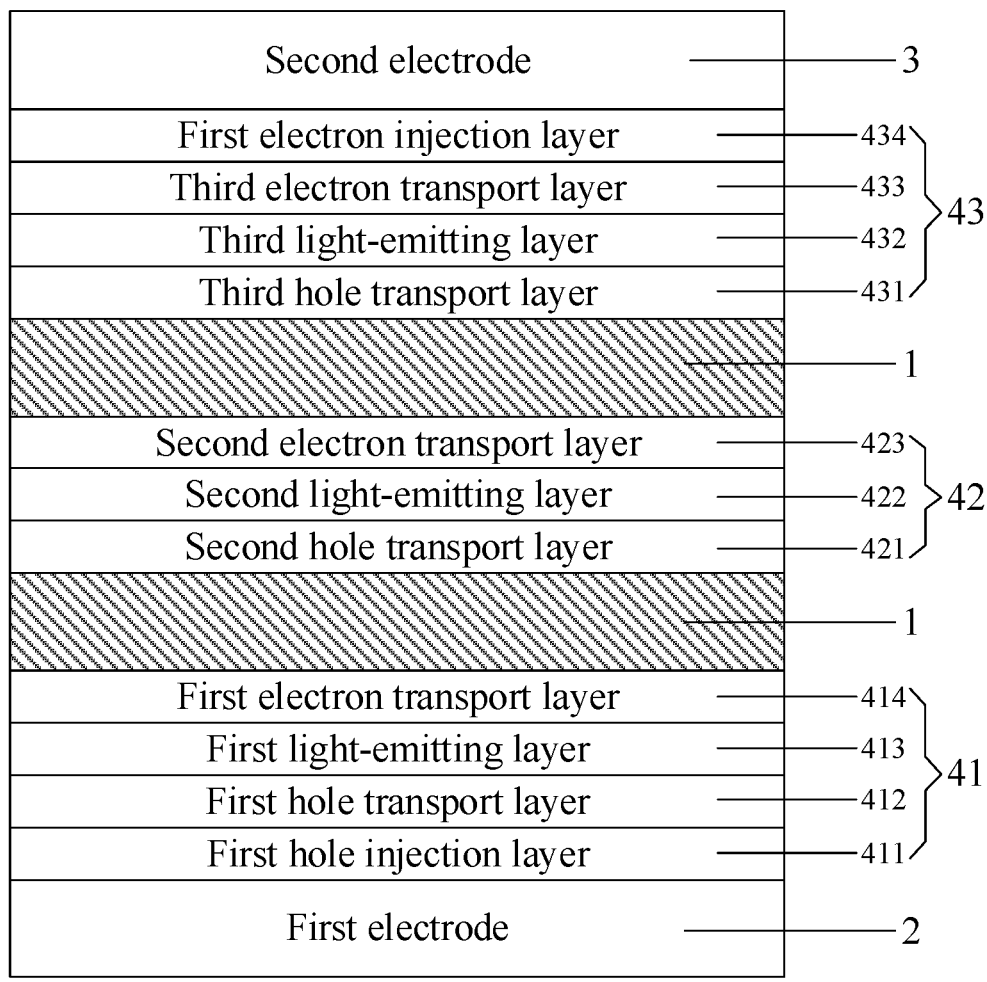
FIG. 5 is a schematic structural diagram of yet another organic electroluminescent device according to an embodiment of the present disclosure.
Figure 6:
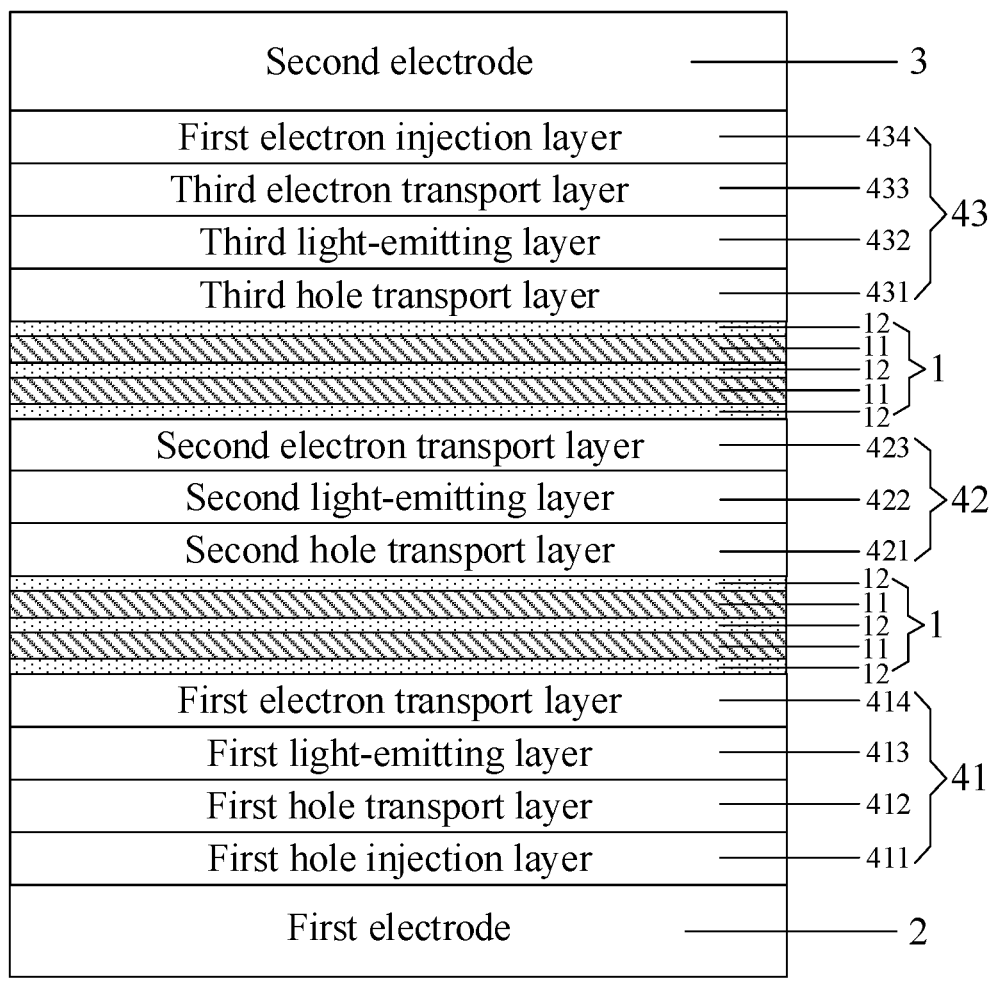
FIG. 6 is a schematic structural diagram of yet another organic electroluminescent device according to an embodiment of the present disclosure.

In specific implementation, in the above organic electroluminescent device provided by the embodiment of the present disclosure, as shown in FIGS. 5 and 6, the first light-emitting functional layer 41 includes a first light-emitting layer 413 and at least one of a first hole injection layer 411, a first hole transport layer 412, or a first electron transport layer 414, preferably, the first light-emitting functional layer 41 includes a first hole injection layer 411, a first hole transport layer 412, a first light-emitting layer 413 and a first electron transport layer 414 which are stacked in sequence, and the first hole injection layer 411 is close to the first electrode 2.

In particular, a material of the first hole injection layer 411, a material of the first hole transport layer 412, a material of the first light-emitting layer 413 and a material of the first electron transport layer 414 are the same as those in the prior art, and will not be described herein.

In specific implementation, in the above organic electroluminescent device provided by the embodiment of the present disclosure, as shown in FIGS. 5 and 6, the second light-emitting functional layer 42 includes a second light-emitting layer 422 and at least one of a second hole transport layer 421 or a second electron transport layer 423, preferably the second light-emitting functional layer 42 includes the second hole transport layer 421, the second light-emitting layer 422, and the second electron transport layer 423 which are stacked in sequence, and the second hole transport layer 421 is close to the first electrode 2.

In particular, a material of the second hole transport layer 421, a material of the second light-emitting layer 422 and a material of the second electron transport layer 423 are the same as those in the prior art, and will not be described herein.

In specific implementation, in the above organic electroluminescent device provided by the embodiment of the present disclosure, as shown in FIGS. 5 and 6, the third light-emitting functional layer 43 includes a third light-emitting layer 432 and at least one of a third hole transport layer 431, a third electron transport layer 433, or a first electron injection layer 434, preferably, the third light-emitting functional layer 43 includes the third hole transport layer 431, the third light-emitting layer 432, the third electron transport layer 433, and the first electron injection layer 434 which are stacked in sequence, and the third hole transport layer 431 is close to the first electrode 2.

Specifically, a material of the third hole transport layer 431, a material of the third light-emitting layer 432, a material of the third electron transport layer 433, and a material of the first electron injection layer 434 are the same as those in the prior art, and will not be described herein.

Figure 7A:
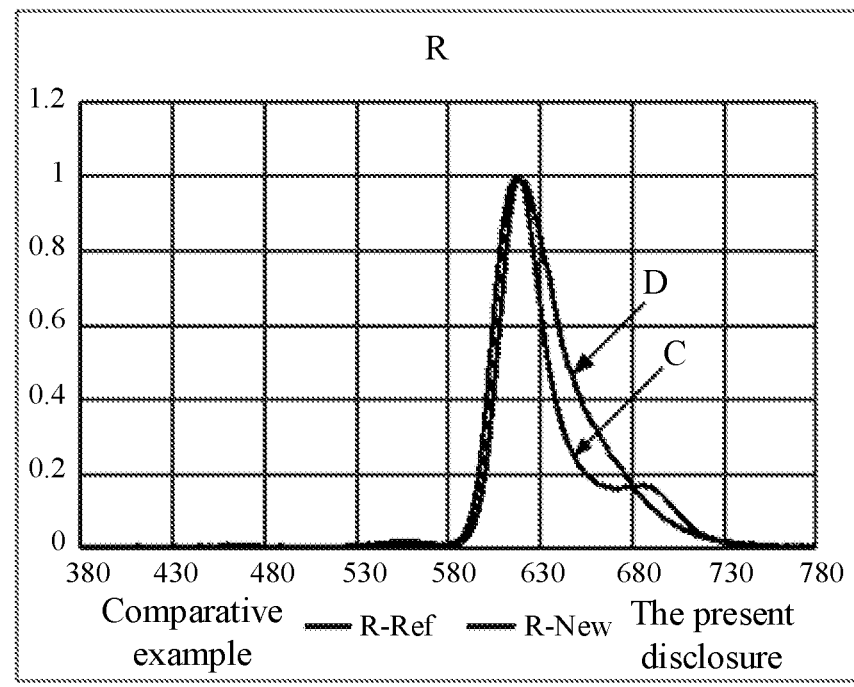
FIG. 7A is a schematic diagram of a red emission spectrum in organic electroluminescent devices in the prior art and an embodiment of the present disclosure.
Figure 7B:
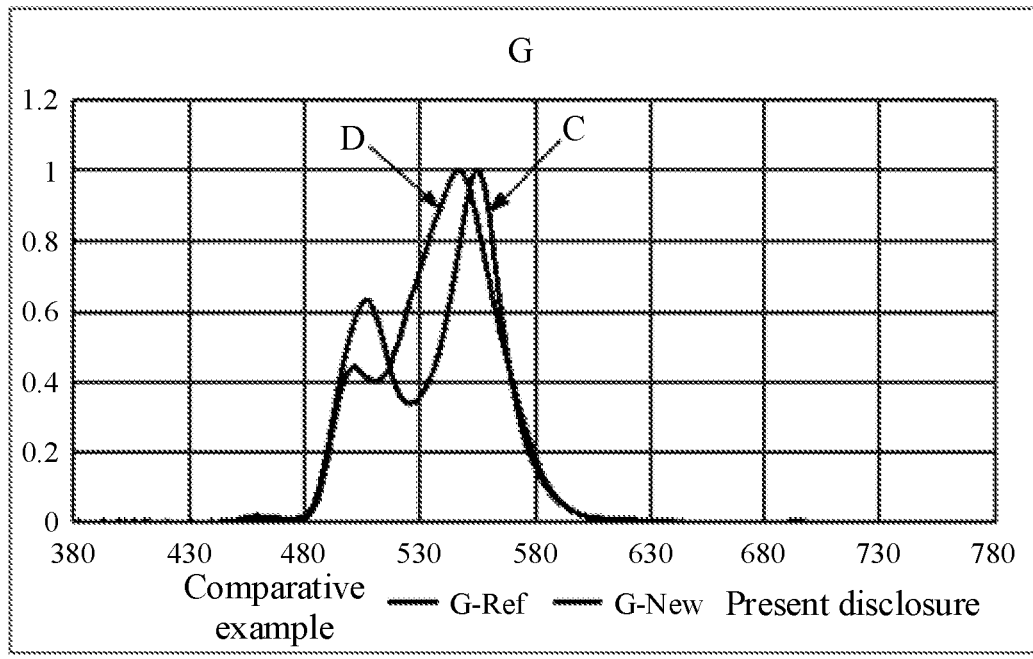
FIG. 7B is a schematic diagram of a green emission spectrum in organic electroluminescent devices in the prior art and an embodiment of the present disclosure.
Figure 7C:
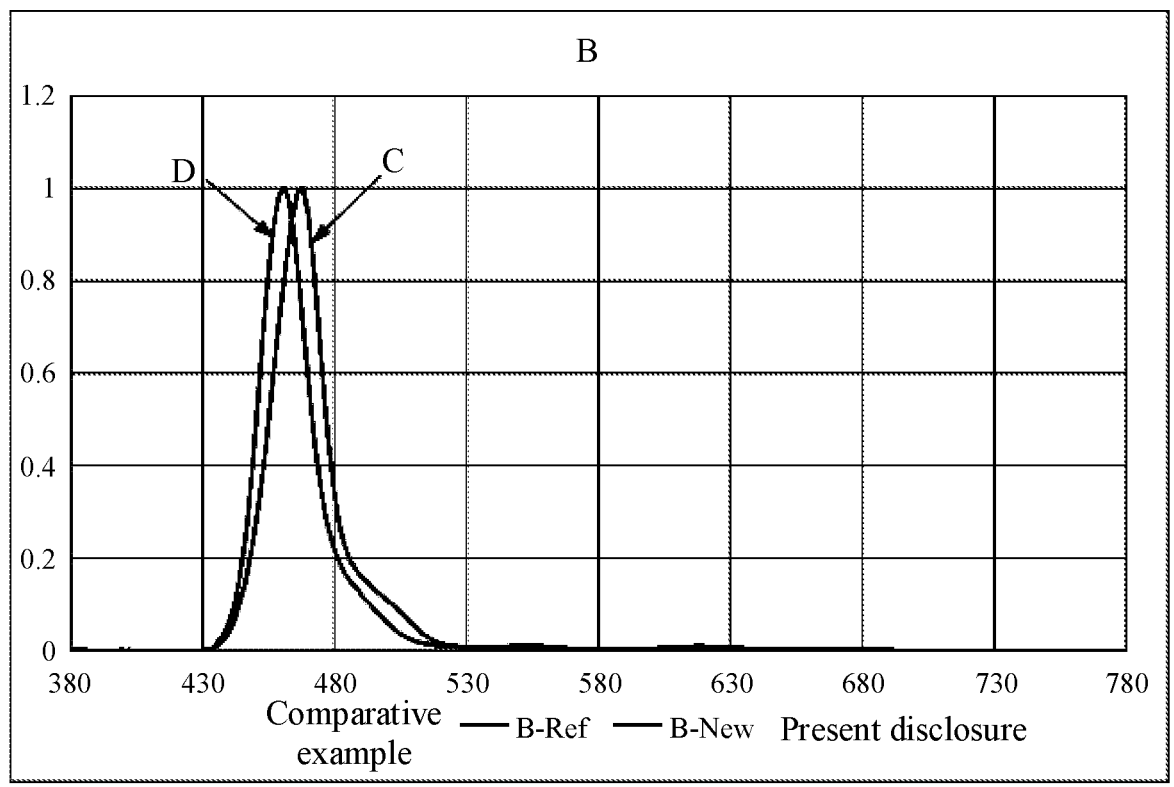
FIG. 7C is a schematic diagram of a green-blue emission spectrum in organic electroluminescent devices in the prior art and an embodiment of the present disclosure.
Figure 8:
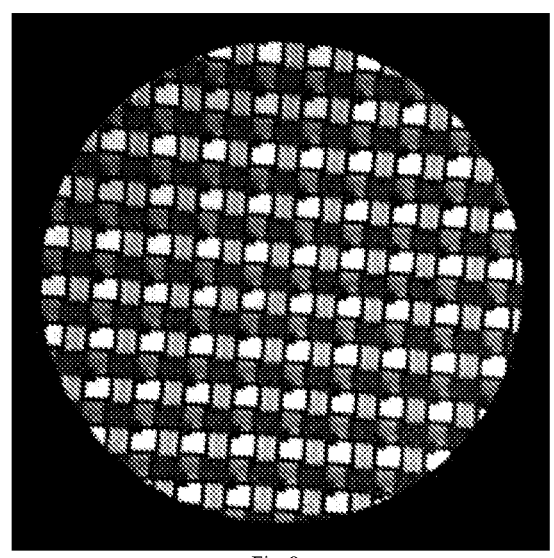
FIG. 8 is a light-emitting schematic diagram of an organic electroluminescent device according to an embodiment of the present disclosure.

A charge generation layer in the prior art employs only one electron transport material and doped lithium, emission spectra of light-emitting functional layers of different colors in an organic electroluminescent device in the prior art and the organic electroluminescent device provided by the embodiment of the present disclosure are tested, as shown in FIGS. 7A-7C. FIG. 7A shows an emission spectrogram of a first light-emitting functional layer (the light emission color is red, R) in the prior art (Comparative example) and an emission spectrogram of the first light-emitting functional layer 41 (the light emission color is red, R) in the embodiment of the present disclosure. FIG. 7B shows an emission spectrogram of a second light-emitting functional layer (the light emission color is green, G) in the prior art (Comparative example) and an emission spectrogram of the second light-emitting functional layer 42 (the light emission color is green, G) in the embodiment of the present disclosure. FIG. 7C shows an emission spectrogram of a third light-emitting functional layer (the light emission color is blue, B) in the prior art (Comparative example) and an emission spectrogram of the third light-emitting functional layer 43 (the light emission color is blue, B) in the embodiment of the present disclosure. C in FIG. 7A, FIG. 7B, and FIG. 7C shows red emission spectra in the prior art (Comparative example), and D in FIG. 7A, FIG. 7B, and FIG. 7C shows red emission spectra in the embodiment of the present disclosure. It can be seen that by arranging the charge generation layer according to the embodiment of the present disclosure, miscellaneous peaks in the red, green and blue emission spectra can be significantly reduced relative to miscellaneous peaks in the prior art. As shown in FIG. 8, pixels emit light independently, and the light emission crosstalk phenomenon of adjacent pixels is reduced, thus reducing the transverse leakage problem.

Also, the inventors of the present disclosure have found that the charge generation layer only employs one electron transport material and doped lithium in the prior art, compared with the condition that two electron transport materials with different mobilities and doped lithium are used in the embodiment of the present disclosure, the average color gamut of the organic electroluminescent device in the prior art can reach 90.7%, the average color gamut of the organic electroluminescent device in the embodiment of the present disclosure can reach 95.4%, and the average color gamut of the organic electroluminescent device in the embodiment of the present disclosure can be improved by about 5% with respect to the prior art.

Based on the same inventive concept, an embodiment of the present disclosure also provides an organic light-emitting apparatus, including the above organic electroluminescent device provided by the embodiment of the present disclosure. Since the principle of solving the problem of the organic light-emitting apparatus is similar to that of the aforementioned organic electroluminescent device, the implementation of the organic light-emitting apparatus can refer to the implementation of the aforementioned organic electroluminescent device, and repetitions are omitted. The organic light-emitting apparatus can be any product or component with the display or touch function, such as a mobile phone, a tablet computer, a television, a display, a notebook computer, a digital photo frame, and a navigator.

In specific implementation, the above haptic feedback apparatuses provided by the embodiments of the present disclosure may also include other functional structures well known to those skilled in the art, which will not be described in detail here.

The embodiments of the present disclosure provide the charge generation layer, the organic electroluminescent device, and the organic light-emitting apparatus, by employing the first electron transport material and the second electron transport material which have different electron mobilities, the first electron transport material and the second electron transport material mainly providing electrons, the difference in mobility may increase the difficulty of electron transport, generally reducing the potential for transverse leakage; and by interaction and restriction of the doped first metal material with the first electron transport material and the second electron transport material, the carrier flow has a certain directionality, which can reduce the quantity of electrons transported laterally, and increase the quantity of electrons transported longitudinally, and when the charge generation layer is applied to the organic electroluminescent device, the problem of transverse leakage can be reduced, and the color gamut of the organic electroluminescent device can be increased, thereby prolonging the service life of the organic electroluminescent device.

Although preferred embodiments of the present disclosure have been described, those skilled in the art can make additional changes and modifications to these embodiments once they know the basic inventive concepts. Therefore, the appended claims are intended to be explained as including the preferred embodiments and all changes and modifications falling within the scope of the present disclosure.

Apparently, those skilled in the art can make various changes and modifications to the embodiments of the present disclosure without departing from the spirit and the scope of the embodiments of the present disclosure. Thus, if these changes and modifications of the embodiments of the present disclosure fall within the scope of the claims of the present disclosure and their equivalents, the present disclosure is also intended to include these changes and modifications.

What is claimed is:

1. A charge generation layer, wherein:
a material of the charge generation layer comprises a first electron transport material, a second electron transport material, and a first metal material doped in the first electron transport material and the second electron transport material, wherein an electron mobility of the first electron transport material is different from an electron mobility of the second electron transport material;
wherein the charge generation layer further comprises first charge generation layers and second charge generation layers which are alternately stacked, wherein a material of the first charge generation layer comprises the first electron transport material, the second electron transport material, and the first metal material, a material of the second charge generation layer is different from the material of the first charge generation layer, and a quantity of the second charge generation layers is greater than a quantity of the first charge generation layers.

2. The charge generation layer according to claim 1, wherein a ratio of the electron mobility of the first electron transport material to the electron mobility of the second electron transport material is greater than or equal to 10 and less than or equal to 100.

3. The charge generation layer according to claim 1, wherein a thickness of the charge generation layer is less than or equal to 20 nm.

4. The charge generation layer according to claim 1, wherein the material of the second charge generation layer comprises a third electron transport material and a second metal material doped in the third electron transport material.

5. The charge generation layer according to claim 4, wherein:
the third electron transport material is the same as the first electron transport material, or the third electron transport material is the same as the second electron transport material; and
the second metal material is the same as the first metal material.

6. The charge generation layer according to claim 1, wherein a sum of the quantity of the first charge generation layers and the quantity of the second charge generation layers is in a range of 3 to 7.

7. The charge generation layer according to claim 6, wherein the quantity of the first charge generation layers is greater than or equal to 2, and a doping concentration of the first metal material in the first charge generation layers varies in a gradient along a thickness direction of the charge generation layer.

8. The charge generation layer according to claim 1, wherein a thickness of the first charge generation layer is less than or equal to 3 nm and a thickness of the second charge generation layer is less than or equal to 3 nm.

9. The charge generation layer according to claim 4, wherein the first metal material and the second metal material each comprise lithium.

10. The charge generation layer according to claim 4, wherein a doping concentration of the first metal material and a doping concentration of the second metal material are in a range of 1% to 5%.

11. The charge generation layer according to claim 1, wherein the first electron transport material comprises 1,3,5-tris (1-phenyl-1H-benzoimidazol-2-yl) benzene, and the second electron transport material comprises phenanthroline.

12. An organic electroluminescent device, comprising:
a first electrode;
a second electrode opposite to the first electrode;
at least two light-emitting functional layers, stacked with each other and located between the first electrode and the second electrode; and
a charge generation layer between every two adjacent light-emitting functional layers; wherein the charge generation layer is the charge generation layer according to claim 1.

13. The organic electroluminescent device according to claim 12, wherein the at least two light-emitting functional layers comprise a first light-emitting functional layer, a second light-emitting functional layer, and a third light-emitting functional layer which are stacked, wherein the first light-emitting functional layer is close to the first electrode, the third light-emitting functional layer is close to the second electrode, and the first light-emitting functional layer, the second light-emitting functional layer, and the third light-emitting functional layer are provided with different light emission colors.

14. The organic electroluminescent device according to claim 13, wherein the first light-emitting functional layer comprises a first hole injection layer, a first hole transport layer, a first light-emitting layer, and a first electron transport layer which are stacked in sequence, wherein the first hole injection layer is close to the first electrode.

15. The organic electroluminescent device according to claim 13, wherein the second light-emitting functional layer comprises a second hole transport layer, a second light-emitting layer, and a second electron transport layer which are stacked in sequence, wherein the second hole transport layer is close to the first electrode.

16. The organic electroluminescent device according to claim 13, wherein the third light-emitting functional layer comprises a third hole transport layer, a third light-emitting layer, a third electron transport layer, and a first electron injection layer which are stacked in sequence, wherein the third hole transport layer is close to the first electrode.

17. The organic electroluminescent device according to claim 13, wherein the first electrode is an anode and the second electrode is a cathode.

18. An organic light-emitting apparatus, comprising the organic electroluminescent device according to claim 12.

19. The charge generation layer according to claim 2, wherein a thickness of the charge generation layer is less than or equal to 20 nm.

* * * * *